United States Patent
Biber et al.

(10) Patent No.: US 10,132,886 B2
(45) Date of Patent: Nov. 20, 2018

(54) MAGNETIC RESONANCE DEVICE

(71) Applicants: Stephan Biber, Erlangen (DE); Andreas Fackelmeier, Thalmässing (DE); Markus Vester, Nürnberg (DE)

(72) Inventors: Stephan Biber, Erlangen (DE); Andreas Fackelmeier, Thalmässing (DE); Markus Vester, Nürnberg (DE)

(73) Assignee: Siemens Aktiengesellschaft, München (DE)

(*) Notice: Subject to any disclaimer, the term of this patent is extended or adjusted under 35 U.S.C. 154(b) by 340 days.

(21) Appl. No.: 15/015,093

(22) Filed: Feb. 3, 2016

(65) Prior Publication Data

US 2016/0223629 A1 Aug. 4, 2016

(30) Foreign Application Priority Data

Feb. 4, 2015 (DE) .................. 10 2015 201 963

(51) Int. Cl.
*G01R 33/36* (2006.01)
(52) U.S. Cl.
CPC ................ *G01R 33/3685* (2013.01)
(58) Field of Classification Search
CPC ................................. G01R 33/3685
See application file for complete search history.

(56) References Cited

U.S. PATENT DOCUMENTS

| | | | |
|---|---|---|---|
| 7,777,492 B2 | 8/2010 | Vernickel et al. | |
| 8,547,098 B2 | 10/2013 | Biber | |
| 2006/0091884 A1* | 5/2006 | Takahashi | G01R 33/483 324/318 |
| 2010/0329527 A1* | 12/2010 | Iannotti | G01R 33/3621 382/131 |
| 2011/0148418 A1 | 6/2011 | Findeklee | |
| 2012/0187950 A1 | 7/2012 | Biber et al. | |
| 2013/0033835 A1* | 2/2013 | Taracila | H05K 1/025 361/767 |

(Continued)

FOREIGN PATENT DOCUMENTS

| | | |
|---|---|---|
| DE | 102010031933 B4 | 7/2013 |
| JP | 2012500082 A | 1/2012 |
| KR | 20130029747 A | 3/2013 |

OTHER PUBLICATIONS

German Office Action for German Application No. 102015201963.2, dated Dec. 23, 2015, with English Translation.

(Continued)

*Primary Examiner* — Rodney Bonnette
(74) *Attorney, Agent, or Firm* — Lempia Summerfield Katz LLC

(57) ABSTRACT

An MR device includes at least one body coil for generating a B1 magnetic field and at least one radiofrequency line routed through the B1 magnetic field. The at least one radiofrequency line has at least one frequency filter for blocking a voltage induced by the B1 magnetic field. At least one section of the radiofrequency line routed through the B1 magnetic field is embodied in printed circuit board technology on at least one printed circuit board, and information-carrying signals may be transmitted over the at least one radiofrequency line on a different frequency than the frequency of the voltage induced by the B1 magnetic field.

12 Claims, 2 Drawing Sheets

(56) References Cited

U.S. PATENT DOCUMENTS

2013/0050031 A1* 2/2013 Zhu ................... H01Q 1/523
                                                    343/702
2013/0241557 A1   9/2013 Biber et al.
2013/0295867 A1* 11/2013 Harris, III .......... G01R 33/3664
                                                    455/277.1

OTHER PUBLICATIONS

Korean Office Action for Korean Application No. 10-2016-0012303, dated Mar. 22, 2017, with English Translation.
Korean Office Action for Korean Application No. 10-2016-0012303, dated Sep. 19, 2017, with English Translation.

* cited by examiner

MAGNETIC RESONANCE DEVICE

This application claims the benefit of DE 10 2015 201 963.2, filed on Feb. 4, 2015, which is hereby incorporated by reference in its entirety.

BACKGROUND

The present embodiments relate to a magnetic resonance (MR) device.

In MR tomography as practiced today, images having a high signal-to-noise ratio (SNR) are generally acquired using "local coils" (e.g., "loops"). In this case, the excited nuclei of a measurement object induce a voltage in the local coils. The induced voltage is amplified by a low-noise preamplifier (LNA) and finally forwarded at the MR frequency via a cable connection to a receiver (e.g., receive electronics) of an MR receive system of an MR device.

Powerful devices known as "high-field" systems are employed in order to improve the signal-to-noise ratio, including in the case of high-resolution images. The basic field strengths of such systems currently range up to 3 tesla (T) and higher. Since it is often possible to connect a greater number of local coils or loops to the MR receive system than the number of receivers present, a switching matrix (e.g., an "RCCS") is installed between the local coils and the receivers. The switching matrix routes or leads the currently active receive channels (each having one or more local coils) to the available receivers. By this, a greater number of local coils than there are receivers present may be connected, since with whole-body coverage, only the local coils that are located in the Field of View (FoV) or covered visual field or in a homogeneity volume of the magnet may be read out.

A local coil may have one or more coil elements (e.g., antenna elements or receive antennas). For example, a local coil that includes a plurality of coil elements may be referred to as an "array coil". A local coil may include the at least one coil element, the low-noise preamplifier, further electronics and cabling, an enclosure, and may also include a cable with plug connector by which the local coil is connected to the rest of the MR device. The MR device has, for example, at least one MR receive system.

The local coils are normally located in a transmit field (e.g., B1 magnetic field) of a whole-body coil or simply "body coil". The body coil is a large coil that encircles an object that is to be measured, such as a body, and that is used to excite the spins in the measurement object. The body coil generates a circular or elliptical B1 magnetic field. The B1 magnetic field causes currents to be induced on all conductors that are located in the field. For example, on longer cables (e.g., embodied as coaxial cables), this may lead to resonance effects due to the cables acting as an antenna, causing high currents to flow on the outside surfaces of the cable sheaths. The high currents potentially pose a risk to the patient as a result of a buildup of heat. Long before the currents are so high that a risk of injury to the patient becomes relevant, the B1-induced currents may furthermore cause secondary B1 fields on the conductor structures of the cables that destroy a B1 homogeneity of the body coil transmit field.

A further problem with the use of a coaxial cable occurs if the coaxial cable experiences a discontinuity (e.g., if the coaxial cable is soldered onto a printed circuit board or the coaxial state is exited in some other way). In such a case, the preamplified receive signals may pass from the inside of the sheath to the outside. If the coaxial cable is routed close to and along the length of a coil element, the preamplified signal may feed back again into the local coil, thereby resulting in the self-oscillation of the associated local coil. In this state, the local coil may not be used for MR imaging.

For this reason, all line structures that are significantly longer than several tens of cm in high-field systems (e.g., of 1.5 T up to 3 T or more) are to be provided with standing wave traps (SWTs). The standing wave traps are resonant blocking circuits that suppress the flow of current in the range of the resonance frequency. In prior art MR systems, the transmit frequency of the body coil and the receive frequency of the local coils, as well as the signal that is transferred from the local coils on cables to the system, are identical, so in most cases, a solution is adopted for building a standing wave trap having two coils; one of the two coils connects an inner sheath surface of two sheath sections, and the other of the two coils connects an outer sheath surface of the two sheath sections and is grounded at both ends via a respective resistor. As a result, the standing wave current generated by the transmit or TX field is suppressed only on the outer surface of the sheath of the coaxial cable, but not on the inner surface thereof. A suppression on the inner surface is not permissible, because otherwise, the wanted signal is also suppressed. Although other designs of standing wave traps, such as the "bazooka" balun-type shield current cable trap, have a geometrically different structure, the standing wave traps are also aimed at suppressing only the current on the outer surface of the sheath and allowing the current on the inner surface to flow unimpeded at the MR frequency.

Standing wave trap chains or "SWT chains" in present-day use consist of sleeve baluns that have a number of individual parts (e.g., printed circuit boards, enclosures, screws, etc.), all of which require labor-intensive and time-consuming individual mounting. This provides that standing wave traps composed of L/C combinations may currently only be wound manually and are manually produced special parts made specifically for MR applications. This leads to a need for balancing (e.g., standing wave traps of contemporary design are not easily tunable due to the fact that the inductance is defined by the number of turns of the coax inductance) and results in very high costs.

The use of coaxial cables also leads to high costs due to the fact that coaxial cables are approximately 5-8 times more expensive than simple stranded wires or other solutions.

A very large number of standing wave traps connected in parallel diminish the barrier effect with respect to the standing wave because the parallel connection arrangement leads to a lower resistance with regard to the standing wave.

Because of the large diameter and small minimum bending radius of the coaxial cables, standing wave traps also have high space requirements (e.g., in order to accommodate the coaxial cable wound to form an inductance). The space requirement in local coils is a problem, for example, for local coils that are designed to be mechanically flexible.

U.S. Pat. No. 7,777,492 B2 discloses an arrangement for transmitting an informative signal generated by a suitable signal generator (e.g., from a first electrical site to a second electrical site). The first electrical site is connected to the second electrical site by a capacitively coupled transmission line. Capacitors configured in a distributed or lumped arrangement may be used in order to realize such a capacitively coupled transmission line. The arrangement may be connected to an add-on device, which may include a spectrometer, a further signal generator, a tuning device, etc. The further signal is generated by the add-on device and transported via the capacitively coupled transmission line in a direction from the second electrical site to the first electrical site. The further signal may be used for feeding an amplifier or for carrying the signal. The arrangement further relates to a magnetic resonance compatible device, a magnetic resonance imaging system, and a method for sensing magnetic resonance energy.

DE 10 2010 012 393 A1 or U.S. Pat. No. 8,547,098 B2 discloses a magnetic resonance system including at least one coil and at least one coaxial line connecting the coil to an electronic receive system. The coil has a preprocessing device for converting the received signals to at least one transmission frequency that is different from the transmit frequency. The coaxial line has at least one standing wave trap having a trap circuit for suppressing sheath waves of the transmit frequency both on the outer surface and on the inner surface of the sheath conductor of the coaxial line. These two documents are aimed at the use of standing wave traps in the inner and outer conductor of coaxial cables that allow intermediate frequencies to pass through, but have a barrier effect with regard to the Larmor frequency.

DE 10 2010 031 933 A1 or US 2012/0187950 A1 discloses that a printed circuit board is embodied as flat (e.g., having a top side and a bottom side, each of which is delimited by long and short lateral edges). Narrow sides extend from the top side to the bottom side on the long lateral edges, and end faces extend from the top side to the bottom side on the short lateral edges. A number of terminations for shielded cables are arranged on the top side in proximity to one of the end faces. Each of the terminations has at least one contact that is connected to a respective conductor track of the printed circuit board that, starting from the respective contact, extends in the direction of the other end face. The respective conductor track is connected either to a respective local coil for magnetic resonance applications that is arranged on the printed circuit board or to a contact of a respective further termination for a respective further shielded cable that is arranged on the top side or on the bottom side. The local coil and/or at least one of the further terminations is arranged in proximity to the other end face. The conductor tracks run in at least one intermediate layer of the printed circuit board that is arranged between the top side and the bottom side. A basic shield that is impervious to frequencies in the magnetic resonance range is arranged on the top side and/or on the bottom side, and an auxiliary shield that is impervious to frequencies in the magnetic resonance range and is electrically connected to the basic shield is disposed on the narrow sides. These two documents are aimed at replacing a cable harness having standing wave traps in the form of sleeve baluns by an elongate printed circuit board and at routing the line in the interior of an RF shield. The flow of current at the MR frequency is suppressed on the shield by sleeve baluns.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a possibility for transmitting radiofrequency signals through a B1 magnetic field of an MR device that may be implemented at particularly low cost is provided.

An MR device includes at least one body coil for generating a B1 magnetic field in a predefined homogeneity volume and at least one radiofrequency line routed through the B1 magnetic field or the homogeneity volume. At least one radiofrequency line has at least one frequency filter (referred to hereinafter without loss of generality as a "standing wave trap") for blocking a voltage induced by the B1 magnetic field. At least one section of the radiofrequency line routed through the B1 magnetic field is embodied in printed circuit board technology (e.g., as a conductor track) on at least one printed circuit board, and information-carrying signals may be transmitted over the at least one radiofrequency line on a different frequency than the frequency of the voltage induced by the B1 magnetic field or the frequency or frequency band blocked by the frequency filter.

The MR device has the advantage that the MR device may be produced at a particularly economical cost (e.g., using generally known component placement technologies). For example, printed circuit boards may be populated by automated fabrication methods, for example, using automatic placement machines (e.g., "pick-n-place" machines) having mountable and solderable components (e.g., also for implementing standing wave traps). A labor-intensive and time-consuming manual production of standing wave traps may be dispensed with. There is also no need to use expensive shielded cables such as coaxial cables or the like.

The MR device may also be referred to as an MR system or as an MR installation.

A radiofrequency line may be embodied as a single line or as a group composed of a plurality of lines (e.g., including a forward line and a return line).

The radiofrequency lines may be the same in structure. Alternatively, at least two radiofrequency lines may have characteristics that are different from one another.

Information-carrying signals may be measurement signals generated by the local coils, for example, or signals derived therefrom (e.g., data-processed and/or frequency-shifted signals). Information-carrying signals may also be control signals and/or clock signals. As a result of the frequency separation of the information-carrying signals from the frequency of the voltage induced by the B1 magnetic field, currents induced on the same line may be effectively trapped or attenuated without simultaneously also blocking the information-carrying signals. This is important in the case of an embodiment of the lines in printed circuit board technology (e.g., as conductor tracks), which may not be shielded by cladding.

The information-carrying signals may be transmitted, for example, on a lower intermediate frequency compared to the original frequency. The MR device may have at least one local oscillator that generates an auxiliary signal that is used to downmix the original frequency.

The printed circuit board may, for example, have a plurality of line layers (e.g., on a front side and on a back side). The printed circuit board may, for example, be a multilayer or multi-tiered printed circuit board.

According to one embodiment, the at least one radiofrequency line is connected at at least one end to a respective impedance-matching circuit. This enables signal losses to be reduced during a transmission over the radiofrequency line. Coaxial cables do not require such an impedance-matching circuit. For example, each of the radiofrequency lines may be connected to at least one impedance-matching circuit.

According to a development, the impedance-matching circuit provides a loss-reduced frequency range for at least one radiofrequency line. Via this frequency range, information-carrying signals may be transmitted on precisely one signal frequency.

According to yet another embodiment, the impedance-matching circuit provides a loss-reduced frequency range for at least one radiofrequency line. Via this frequency range, information-carrying signals may be transmitted on a plurality of signal frequencies that are frequency-shifted relative to one another. The number of radiofrequency lines may be reduced further as a result. This may also be referred to as "broadband" impedance matching.

According to yet a further embodiment, the impedance-matching circuit provides a plurality of loss-reduced frequency ranges that are separated from one another in frequency for at least one radiofrequency line. Via these frequency ranges, information-carrying signals may be transmitted in each case on a plurality of signal frequencies that are frequency-shifted relative to one another. This may also be referred to as "narrowband" impedance matching.

According to another embodiment, at least one radiofrequency line is embodied as a symmetric line (e.g., having in each case a forward line or signal line and a return line or ground line). This enables a particularly low-interference signal transmission and also a transmission of direct-current signals serving for the power supply.

The forward line and the return line of at least one respective radiofrequency line may be arranged, for example, on different line layers of the printed circuit board (e.g., on a front side or on a back side). The forward line and the return line may, for example, have a basically identical structure. The return line is also connected to ground, via one or more resistors, for example.

According to a particularly cost-effective embodiment, at least two radiofrequency lines have a common ground (e.g., a common return or ground line).

According to yet another embodiment for improving the transmission characteristics, at least one capacitor is connected between forward line and return line of a common radiofrequency line. The capacitor may, for example, have a value in the pF range. The capacitors may, for example, be placed between the serially connected standing wave traps.

According to a further embodiment, the at least one radiofrequency line is electrically connected to a branch circuit. This enables direct-current signals to be looped into and out of the at least one radiofrequency line in a straightforward manner. The MR device therefore has at least one branch circuit for transmitting at least one direct-current signal over at least one radiofrequency line.

According to another embodiment, the MR device is configured for transmitting a low-frequency clock signal over at least one radiofrequency line (e.g., for generating an intermediate frequency).

According to a further embodiment, the at least one frequency filter is built using SMT components. The SMT components enable a particularly low-cost and fast component placement (including positioning and soldering).

According to yet a further embodiment, the section of the radiofrequency line that is routed through the B1 magnetic field is embodied on precisely one printed circuit board, thereby simplifying assembly and handling. The section may alternatively be embodied on a series composed of a plurality of printed circuit boards (e.g., cascaded printed circuit boards), thereby simplifying the provision thereof in standard printed circuit board sizes. The printed circuit board may include, for example, FR4 or ceramic as a base material.

According to yet another embodiment, the at least one printed circuit board constitutes a part of an MR patient couch of the MR device. The radiofrequency lines then connect, for example, a head part or head end and a foot part or foot end of the patient couch.

The above-described characteristics, features and advantages of this invention, as well as the manner in which these are achieved, will become clearer and more readily understandable in connection with the following description of exemplary embodiments, which are explained in more detail with reference to the schematic drawings. For clarity of illustration reasons, like or like-acting elements may be labeled with the same reference signs in the figures.

DETAILED DESCRIPTION

Figure 1:
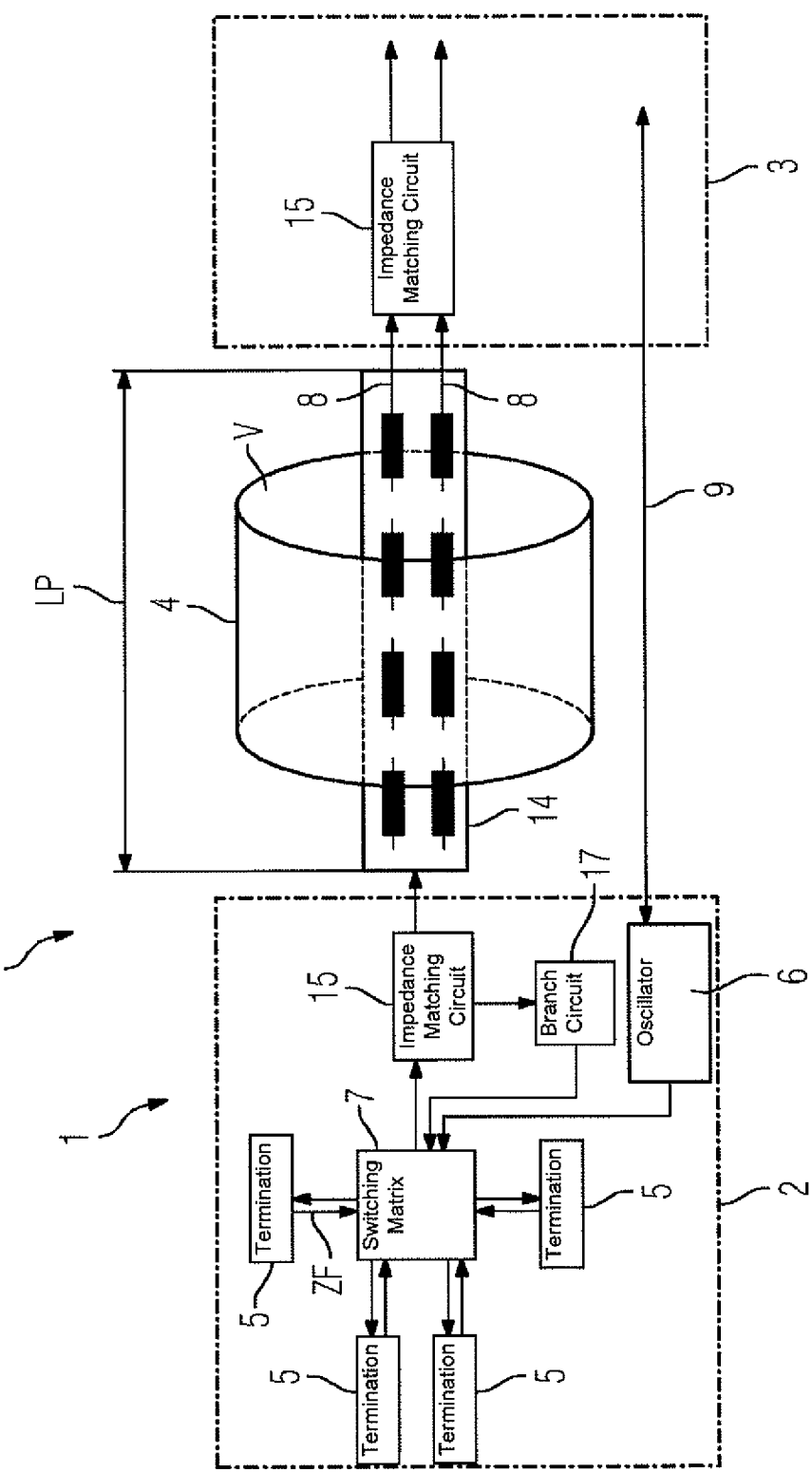
FIG. 1 shows a schematic block diagram of an MR device.

FIG. 1 shows a schematic diagram of a patient couch 1 of an MR device G. The patient couch 1 has a head end 2 and a foot end 3 between which a homogeneity volume V that may be generated by a body coil 4 (which does not constitute a part of the patient couch 1) is located. The homogeneity volume V corresponds at least approximately to a volume that is suitable for the MR measurement of a patient lying on the patient couch 1. The body coil 4 of the MR device G is, for example, stationary, while the patient couch 1 is mounted as displaceable with respect thereto.

The head end 2 has a plurality (e.g., four) of coil connectors or terminations 5 for connecting local coils (not shown). The terminations 5 also effect a frequency conversion of measurement signals received by the local coils to lower intermediate frequencies ZF. For this purpose, a local oscillator 6 that generates an auxiliary frequency for downmixing the original measurement signals at Larmor frequency to the intermediate frequency or frequencies ZF may be present at the head end 2. For example, at least some of the intermediate frequencies used by the terminations 5 may be different from one another. For example, the terminations 5 may deliver measurement signals on different intermediate frequencies ZF.

The terminations 5 are connected to a switching matrix 7 by which only ZF signals (e.g., measurement signals) of selected terminations 5 are forwarded.

The switching matrix 7 is connected to the foot end 3 of the patient couch 1 via a plurality of radiofrequency lines 8 leading through the homogeneity volume V and at that point is connected further to an MR receive system (not shown) of the MR device G. Thus, the ZF measurement signals of different combinations of local coils may be transmitted over the radiofrequency lines 8 by an appropriate setting of the switching matrix 7. For example, a greater number of local coils may be present in this way than there are radiofrequency lines 8 available.

A low-frequency clock signal (e.g., having a frequency value of 5 or 10 MHz) may be transmitted from the foot end 3 to the head end 2 of the patient couch 1 over at least one of the radiofrequency lines 8 or optionally over a dedicated signal line 9. From this, the fixed-frequency local oscillator signals or auxiliary signals (e.g., having a frequency value of 115 MHz and 135 MHz) that are provided for downmixing the MR measurement signals of the local coils on the Larmor frequency to the intermediate frequency may be obtained in situ. The dedicated signal line 9 may be embodied, for example, as an optical fiber running parallel to the radiofrequency lines 8.

Figure 2:
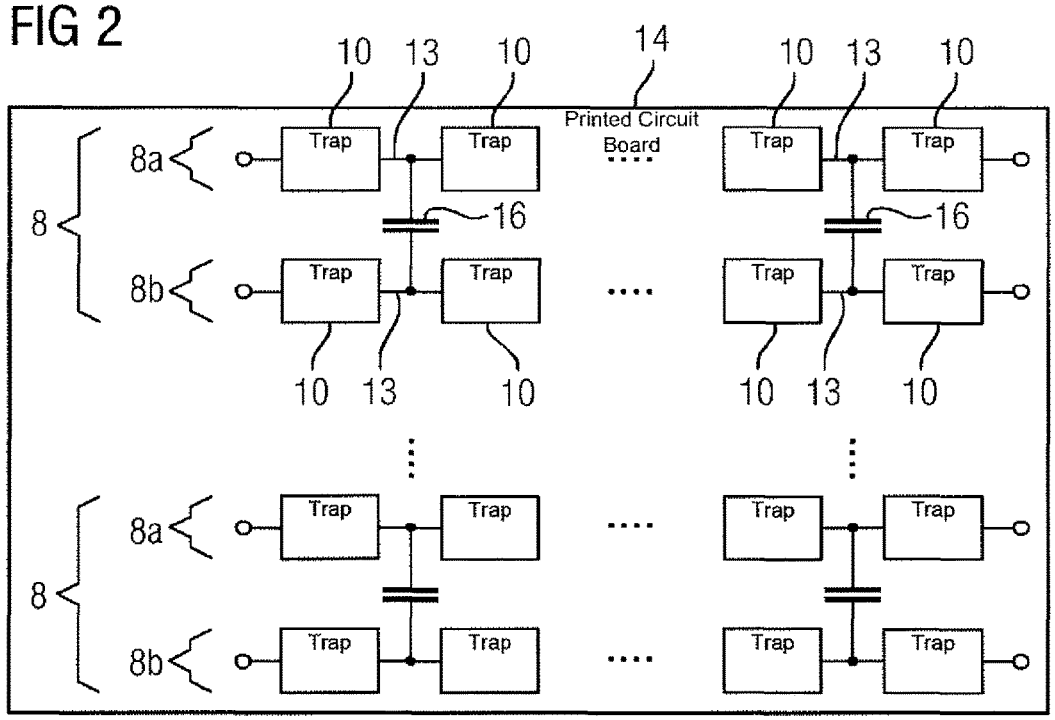
FIG. 2 shows a schematic block diagram of one embodiment of a printed circuit board of the MR device that is equipped with radiofrequency lines.
Figure 3:
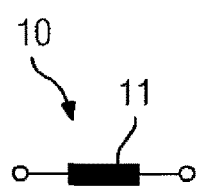
FIG. 3 shows a circuit diagram of a possible implementation of a standing wave trap of the radiofrequency lines of the printed circuit board from FIG. 2.
Figure 4:
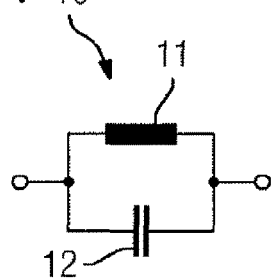
FIG. 4 shows a circuit diagram of a further possible implementation of a standing wave trap of the radiofrequency lines of the printed circuit board from FIG. 2.

Each of the radiofrequency lines 8 has a plurality of frequency filters in the form of standing wave traps 10, as shown in greater detail in FIG. 2. The standing wave traps 10 may be embodied, for example, as inductors or "chokes" in the form of a coil 11 (see FIG. 3) (e.g., having a self-inductance L in a range between 0.5 μH and 20 μH, or as frequency traps or simply "traps" in the form of an LC resonant circuit including a coil 11 and a capacitor 12 (see FIG. 4), having a resonance frequency corresponding to a Larmor frequency). The standing wave traps 10 block, for example, currents at a frequency induced by the B1 magnetic field (e.g., at a Larmor frequency). In this case, standing wave traps 10 embodied as chokes typically exhibit a lowpass characteristic, while standing wave traps 10 embodied as traps exhibit a band stop characteristic. Although the implementation of the standing wave traps 10 using chokes results in a higher insertion attenuation of the ZF signal compared to an implementation using traps because the chokes having high L also possess a higher ohmic series resistance Rs, the barrier effect with respect to the standing waves is nonetheless also noticeably more effective. The radiofrequency lines 8 may also be referred to as "barrier chains".

The radiofrequency lines 8 are in this case implemented not as coaxial cables, but in printed circuit board technology (e.g., as conductor tracks or conductor track sections 13). The printed circuit board 14 is populated with the components 11 or 11, 12 of the standing wave traps 10 using surface mount technology (SMT). The components 11 or 11, 12 are therefore, for example, SMT components, thus permitting a particularly low-cost, automation-capable component placement (e.g., using pick-n-place machines) and assembly. The standing wave traps 10 are accordingly connected between adjacent conductor track sections 13 of a radiofrequency line 8. For example, the conductor track sections 13, and consequently the intervals between succeeding standing wave traps 10, may amount to approximately 10 cm to 40 cm.

The conductor track sections 13 may have, for example, an impedance between 50 ohms and 100 ohms, which is simple to implement in manufacturing process terms. Conductor track sections 13 at 50 ohms consume more current than similar 100-ohm sections, but on the positive side, are less susceptible to malfunction and easier to fabricate.

The printed circuit board 14 may have, for example, a length LP of between 0.5 and 3 meters. The printed circuit board 14 may be present as a single piece or as multiple pieces in the form of a series of cascaded individual printed circuit boards.

In the case of a printed circuit board configuration with a direct connection of the radiofrequency lines 8 as a whole, however, high mismatching losses result because the high inductance of the standing wave traps 10 together with the small parasitic leakage capacitance of the intermediate conductor track sections 13 form lowpass lines having a high characteristic wave resistance of several kiloohms. In order to keep signal losses (e.g., of the measurement signals) low, the relatively high-impedance radiofrequency lines 8, even at intermediate frequencies, are therefore each connected on both sides (e.g., at the head end and at the foot end) to a respective impedance-matching circuit 15 that matches a system impedance at least approximately to the high characteristic wave impedance of the radiofrequency lines 8.

The impedance-matching circuits 15 therefore serve to match the radiofrequency lines 8 for the intermediate frequencies (e.g., that lie in a range around approximately 10 MHz (between 7.5 MHz and 12.5 MHz or at 8 MHz and 12 MHz)) to the 50-ohm impedance resistance of the MR device G connected thereto (e.g., at the head end to a source impedance of an output amplifier of the terminations 5 of the local coil(s)).

Figure 5:
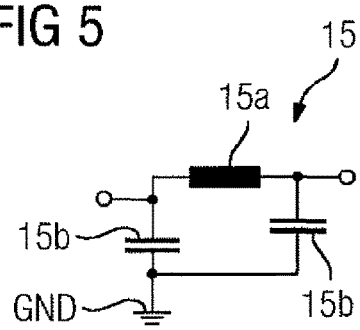
FIG. 5 shows a circuit diagram of a possible implementation of an impedance-matching circuit of the printed circuit board from FIG. 2.

FIG. 5 shows a possible embodiment of an impedance-matching circuit 15 including a coil 15a and two capacitors 15b connected in series. A ground connection GND is inserted into the circuit between the capacitors 15b. The impedance-matching circuits 15 may be disposed on the printed circuit board 14, in which case, corresponding electrical components 15a, 15b may be embodied as SMT components. Alternatively, the impedance-matching circuits 15 may also be present outside of the printed circuit board 14, as shown in FIG. 2.

The impedance matching may be implemented on a broadband basis in order to transmit multiple ZF frequencies or ZF measurement signals over a common radiofrequency line 8 in a frequency-division multiplex mode of operation. This enables a further saving on the number of radiofrequency lines 8. For example, a loss-reduced frequency range having a width of between 7.5 MHz and 12.5 MHz may be generated by the impedance matching arrangement in order to transmit two ZF frequencies at 8 MHz and 12 MHz.

The impedance matching may, however, also be implemented on a narrowband basis (e.g., by providing a plurality of individually matched frequency windows on a radiofrequency line 8). In this way, two loss-reduced frequency ranges may be generated by the impedance matching arrangement (e.g., at 8 MHz+/−500 kHz and at 12 MHz+/−500 kHz) for the purpose of transmitting two ZF frequencies at 8 MHz and 12 MHz, respectively.

In this case, the radiofrequency lines 8 are embodied as symmetric (e.g., double circuit) lines, each having a forward line or signal line 8a and a return line or "ground" line 8b. The return lines 8b are each connected to ground (not shown). A respective return line 8b is therefore provided for each of the forward lines 8a.

The printed circuit board 14 may, for example, have a plurality of line layers (e.g., on a front side and on a back side). For example, the forward lines 8a may run on one of the line layers, and the return lines 8b may run on a different line layer. The printed circuit board 14 may, for example, be a multilayer or multi-tiered printed circuit board.

For example, in this arrangement, a direct current possibly likewise carried by the radiofrequency lines 8 or corresponding forward lines 8a may be more easily returned at low impedance (and consequently with low power dissipation loss). In an arrangement of the standing wave traps 10, for the forward line 8a and the return line 8b as spatially closely adjacent pairs, the antiparallel interference fields caused by the direct currents may compensate for one another in a first approximation and have only a slight distorting effect on the basic magnetic field of the MR device G.

Such a direct current or direct-current signals may be transmitted, for example, from the foot end 3 of the patient couch 1 to the head end 2 of the patient couch 1 in order to supply the electricity-consuming loads located in the head end 2 and also where applicable loads connected thereto (e.g., the terminations 5 and the switching matrix 7 as well as electronics in the local coils) with electrical power.

In order to improve the transmission characteristics, the printed circuit board 14 is populated with additional capacitors 16 in the pF range (e.g., from 6 to 10 pF). The additional capacitors 16 are connected between the forward line 8a and the return line 8b of a radiofrequency line 8. As a result of this, a defined, low characteristic wave resistance (e.g., 400 ohms) is achieved. The capacitors 16 are in each case placed between the serially connected standing wave traps 10. The matching is also made easier by this, and the ripple in the passband is reduced. The capacitors 16 therefore increase the already present distributed capacitance between the forward lines 8a and the return lines 8b that are routed, for example, on the top side and bottom side of a printed circuit board 14. The forward lines 8a and/or the return lines 8b may therefore be used, for example, simultaneously for transporting the information-carrying ZF signals (e.g., measurement signals), for transporting control signals (e.g., for turning off the PIN diodes used by the local coils), as well as for supplying power to active electronics in the local coils and at the head end 2.

Direct-current signals for supplying power may in this case be looped in and out via at least one highpass/lowpass branch circuit 17 (e.g., "bias tee"). The one or more highpass/lowpass branch circuits 17 may be located in the 50-ohm system.

Although the invention has been illustrated and described in greater detail on the basis of the illustrated exemplary embodiments, the invention is not limited thereto, and other variations may be derived herefrom by the person skilled in the art without leaving the scope of protection of the invention.

Thus, a plurality of signal lines may be provided with a common ground, a common ground line, or a plurality of ground systems or ground lines (though fewer in number). The blocking effect is achieved by corresponding coils or traps for standing waves. However, this has the disadvantage that the high impedance of the standing wave traps that lies in the common ground line leads to a strong mutual coupling between the signal lines.

A switching matrix and/or an impedance-matching circuit may also be disposed only at the foot end or only at the head end.

In general, a singular or a plural number may be understood by, for example, "a" or "one" (e.g., in the sense of "at least one" or "one or more"), provided this is not explicitly excluded, for example, by the expression "precisely one", for example.

A specification of a number may include exactly the specified number as well as a typical tolerance range, insofar as this is not explicitly ruled out.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance (MR) device comprising:
a body coil operable to generate a B1 magnetic field; and
a radiofrequency line routed through the B1 magnetic field and having a frequency filter, the frequency filter operable to block a voltage induced by the B1 magnetic field,
wherein a section of the radiofrequency line routed through the B1 magnetic field is configured in printed circuit board technology on at least one printed circuit board,
wherein information-carrying signals are transmittable over the radiofrequency line on a different frequency than a frequency of the voltage induced by the B1 magnetic field, and
wherein the radiofrequency line is connected at the at least one end to a respective impedance-matching circuit.

2. The MR device of claim 1, wherein the at least one impedance-matching circuit provides a loss-reduced frequency range for at least one radiofrequency line, via which frequency range information-carrying signals are transmittable on a plurality of signal frequencies that are frequency-shifted relative to one another.

3. The MR device of claim 1, wherein the at least one impedance-matching circuit provides a plurality of loss-reduced frequency ranges that are separated from one another in frequency for at least one radiofrequency line, via which frequency ranges information-carrying signals are transmittable in each case on a plurality of signal frequencies that are frequency-shifted relative to one another.

4. The MR device of claim 1, wherein at least one radiofrequency line is configured as a symmetric line having a forward line and a return line in each case.

5. The MR device of claim 4, wherein at least one capacitor is connected between the forward line and the return line.

6. The MR device of claim 1, wherein the radiofrequency line is a first radiofrequency line, and the MR device further comprises a second radiofrequency line, and
wherein the first radiofrequency line and the second radiofrequency line have a common ground.

7. The MR device of claim 1, further comprising a branch circuit operable to transmit a direct-current signal over the radiofrequency line.

8. The MR device of claim 1, wherein the MR device is configured to transmit a low-frequency clock signal over the radiofrequency line.

9. The MR device of claim 1, wherein the frequency filter comprises surface mount technology (SMT) components.

10. The MR device of claim 1, wherein the section of the radiofrequency line routed through the B1 magnetic field is configured on precisely one printed circuit board.

11. The MR device of claim 1, wherein the section routed through the B1 magnetic field is configured on a series of printed circuit boards comprising a plurality of printed circuit boards.

12. The MR device of claim 1, wherein the at least one printed circuit board constitutes a part of an MR patient couch of the MR device.

* * * * *